(12) United States Patent
He

(10) Patent No.: US 10,917,093 B1
(45) Date of Patent: Feb. 9, 2021

(54) SELF-ADAPTIVE TERMINATION IMPEDANCE CIRCUIT

(71) Applicant: Micron Technology, Inc., Boise, ID (US)

(72) Inventor: Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/674,348

(22) Filed: Nov. 5, 2019

(51) Int. Cl.
*H03K 19/003* (2006.01)
*H03K 19/00* (2006.01)
*G11C 7/10* (2006.01)
*G11C 11/4093* (2006.01)

(52) U.S. Cl.
CPC ....... *H03K 19/0005* (2013.01); *G11C 7/1057* (2013.01); *G11C 11/4093* (2013.01)

(58) Field of Classification Search
CPC .............. G11C 7/1057; G11C 11/4093; H03K 19/0005
See application file for complete search history.

(56) References Cited

U.S. PATENT DOCUMENTS

| | | | | |
|---|---|---|---|---|
| 6,240,000 B1* | 5/2001 | Sywyk | ................... | G11C 15/00 365/189.05 |
| 6,366,128 B1* | 4/2002 | Ghia | ..................... | H03K 5/151 326/40 |
| 6,812,734 B1* | 11/2004 | Shumarayev | ....... | H04L 25/0278 326/26 |
| 7,724,026 B1* | 5/2010 | Tan | ................ | H03K 19/018528 326/30 |
| 8,446,169 B1* | 5/2013 | Marlett | ............. | H03K 19/0005 326/30 |
| 9,299,440 B2* | 3/2016 | Grunzke | ............ | H03K 19/0005 |
| 9,325,546 B1* | 4/2016 | Mobin | .............. | H04L 25/03878 |
| 10,062,453 B1* | 8/2018 | Griffin | ................ | G11C 11/4076 |
| 2002/0093374 A1* | 7/2002 | Bedarida | ................. | G05F 3/245 327/538 |
| 2007/0013411 A1* | 1/2007 | Asaduzzaman | ...... | H03K 17/164 326/83 |
| 2010/0066450 A1* | 3/2010 | Palmer | ................ | H04L 25/0278 330/261 |
| 2017/0346466 A1* | 11/2017 | Jung | ...................... | H03K 19/20 |
| 2018/0158495 A1* | 6/2018 | Jeon | .................... | H01L 25/0657 |

OTHER PUBLICATIONS

U.S. Appl. No. 16/205,450—Unpublished U.S. Patent Application by Satoh, Y. et al., titled "Reduction of ZQ Calibration Time", filed Nov. 30, 2018, 42 pages.

* cited by examiner

*Primary Examiner* — Kurtis R Bahr
(74) *Attorney, Agent, or Firm* — Perkins Coie LLP

(57) ABSTRACT

A memory system includes a memory device with a termination circuit providing a termination impedance for a data signal in the memory device. The device also includes a calibration circuit configured to set the termination impedance to a predetermined value. The device further includes an impedance adjustment circuit configured to adjust the termination impedance based on a feedback signal indicating a change in the termination impedance due to at least one of a change in a temperature of the memory device or a change in voltage of a voltage bus in the memory device.

21 Claims, 7 Drawing Sheets

SELF-ADAPTIVE TERMINATION IMPEDANCE CIRCUIT

TECHNICAL FIELD

The present disclosure is directed to systems and methods for adjusting termination impedances of an on-die termination circuit in memory systems, and more particularity to a self-adaptive termination impedance circuit that automatically adjusts for changes in the termination impedances due to changes in temperature and/or bus voltage in the memory systems.

BACKGROUND

Semiconductor systems, such as semiconductor memory and processors, transmit data across data communication lines that are configured to have carefully matched impedance values. Variations in certain operating parameters such as temperature, bus voltage or the like can result in impedance mismatches that can adversely affect data transmission rates and quality. In order to mitigate these adverse scenarios, the semiconductor systems can include termination components that have programmable impedances, which can be adjusted based on a calibration process. The semiconductor systems can be set up to perform the calibration process periodically to account for any changes in operating conditions (e.g., changes in the temperature of memory devices in the memory system and/or changes in the bus voltages of the memory devices). However, if there are changes in the operating conditions after a calibration, the calibration codes for the on-die termination circuits can be invalid and thus cause problems with signals terminated on the on-die termination. In some cases, semiconductor systems can be set up to perform a calibration process each time conditions change (e.g., where there is a change in the temperature and/or bus voltages drift). However, performing the calibration process every time conditions change can consume power in the memory systems, which is not insignificant.

In addition, performing calibrations can be time-consuming. For example, in cases where the semiconductor system is a memory such as a SRAM or DRAM, the memory system can include a memory package that has multiple semiconductor components (e.g., semiconductor dies) that each contains one or more memory devices, which contain the memory cells and the termination components. In such memory systems, each memory device must share the external reference calibration device via an external pin when programming the respective termination component based on the results of the calibration process. Because calibrations are typically done sequentially in such devices, as the number of memory devices that share the external reference calibration device increases, the calibration times for the memory systems can get very long.

DETAILED DESCRIPTION

The present disclosure is directed to a memory system that includes on-die terminations for memory devices. The memory system can include a memory device that can have a termination circuit providing a termination impedance for a data signal in the memory device. The memory device also includes a calibration circuit configured to set the termination impedance to a predetermined value. The memory device further includes an impedance adjustment circuit configured to adjust the termination impedance based on a feedback signal indicating a change in the termination impedance due to a change in a temperature of the memory device and/or a change in a bus voltage in the memory device.

Figure 1:
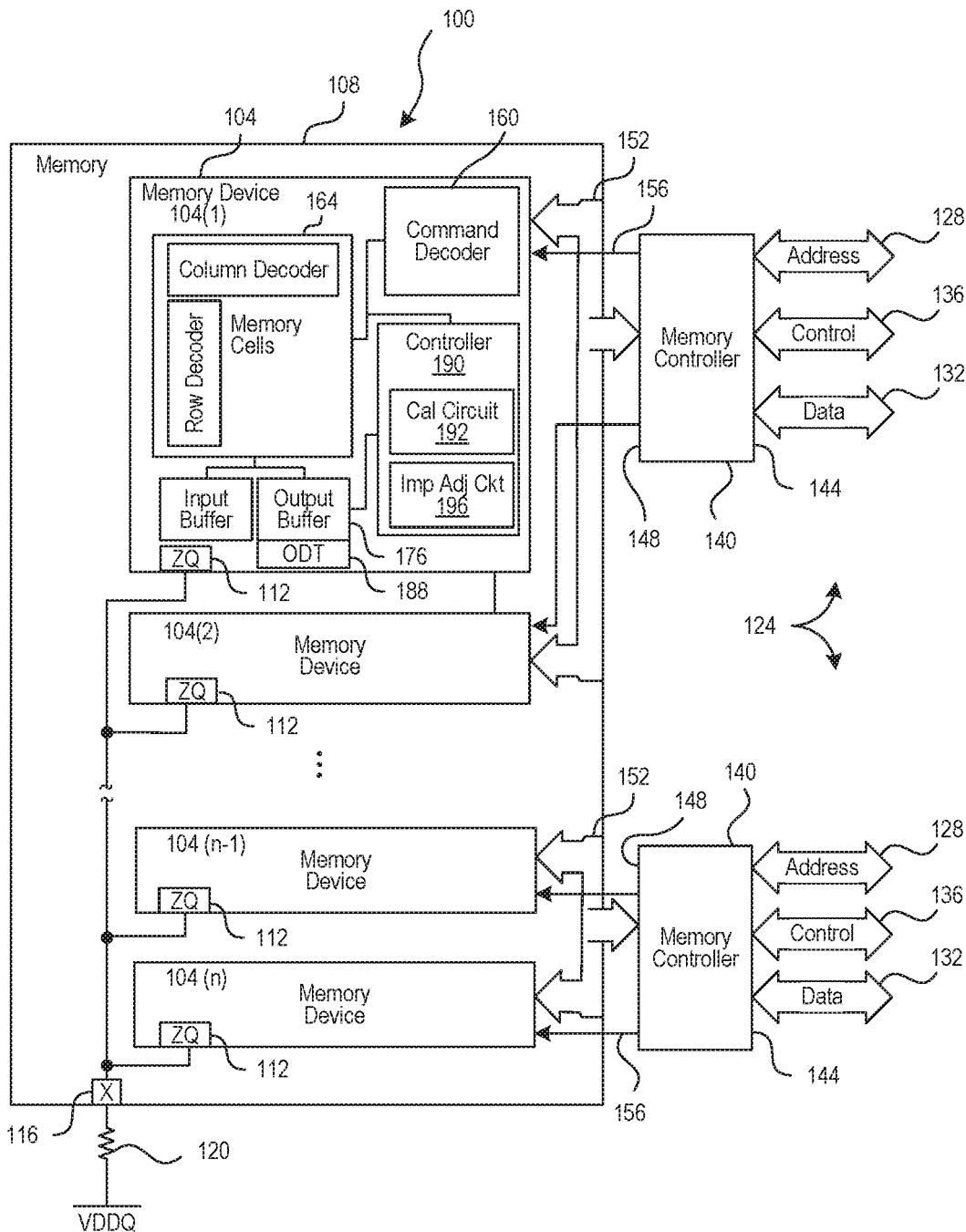
FIG. 1 is block diagram of an embodiment of a memory system in accordance with the present disclosure.

FIG. 1 is block diagram of a memory system in accordance with the present technology. Referring to FIG. 1, the memory system of the present disclosure will be described with reference to a memory system 100, by way of example and not limitation. The memory system 100 may be a volatile memory such as a SRAM or DRAM, or a nonvolatile memory such as a FLASH memory or a ferroelectric memory. In one embodiment, the memory system 100 may be a Double Data Rate (DDR) memory, such as a Low Power Double Data Rate 4 (LPDDR4) or Low Power Double Rate 5 (LPDDR5 or LP5) memory. The memory system 100 can be arranged as a component of a computing device such as a laptop computer, a desktop computer, a cellular or other mobile device, a table computer, personal digital assistant, and so on. The memory system 100 can be mounted in an appropriate memory slot or otherwise interconnected with the computing device such that communication can take place through the pins on the package 108 (i.e., memory module) of the memory system 100. A computing device that includes the memory system 100 may generally include one or more processors (not shown in FIG. 1). The processor or processors can be single core or multi-core in various implementations. Typically, the memory system 100 functions as a passive device in the larger system, receiving and executing commands received from a processor or processor core. Here, the computing device may include a bus interface 124 across which the memory system 100 and the processor or processor cores can communicate. As shown in FIG. 1, the bus interface 124 can include an address bus 128, a data bus 132, and a command bus 136. FIG. 1 shows these various buses as separate components by way of example and not limitation. In some instances, the bus interface 124 can multiplex two or more of these separate buses. For example, in some implementations, the address bus 128 and the command bus 136 can be time division multiplexed such that these buses use the same physical lines in different time slices.

The memory system 100 can be associated with one or more memory controllers 140 that are configured to provide data communication to and from the memory system 100. The memory controller 140 can include a front end 144 that communicates across the bus interface 124. Similarly, the memory controller 140 can include a back end 148 that communicates with the memory system 100. Each memory controller 140 can communicate across a separate memory bus 152 that couples the back end 148 of the memory controller 140 to one or more of the memory devices 104 that are associated with the memory system 100. Each memory bus 152 associated with a given controller 140 can include address, data, and control lines that are coupled in common between the various memory devices 104 with which the controller 140 communicates. Each memory bus 152 can additionally include individual chip select lines 156 that can be selectively asserted to enable one of the memory devices 104 to send or receive data across the common address, data, and control lines. Through the combination of individual chip select lines 156 and common address, data, and control lines, a memory bus 152 associated with a given controller 140 provides separate communication pathways between the controller and each of the various memory devices 104 with which the controller 140 communicates.

In accordance with various embodiments, the memory system 100 can include multiple memory devices 104 that can be arranged on one or more semiconductor components such as, for example, semiconductor dies. In some embodiments, each memory device 104 can correspond to a semiconductor component such as, for example, a semiconductor die. However, in other embodiments, multiple memory devices 104 can be installed on the semiconductor component. The package 108 of the memory system 100 can contain and interconnect the semiconductor components, including the memory devices 104. The package 108 can provide multiple external pins that couple to contact pads arranged on an interior of the package 108. The pins and pads can provide electrical coupling such as between the memory devices 104 and the larger system to which the memory system 100 is coupled, as discussed above. In addition, the pins and pads can provide electrical connections to other components. For example, a ZQ pad and corresponding pin can connect to an external reference calibration device such as, for example, a resistor.

In operation, a processor or processor core sends a command to the memory system 100 by first sending the command across the bus interface 124. A memory controller 140 receives the command from across the bus interface 124 and routes the command to the appropriate memory device 104 on the memory system 100. Here, the memory controller 140 asserts the appropriate chip select line 156 and sends the command across the common address, data, and control lines of the memory bus 152. The appropriate memory device 104 receives the command from the memory controller 140 and initially processes the command through the operation of a command decoder 160. The command decoder 160 can be configured to recognize a plurality of commands that correspond to various operations that may be executed by the memory device 104. In the following discussion, a calibration command is described in order to more particularly illustrate certain embodiments of the present disclosure. It should be appreciated, however, that the command decoder 160 is generally configured to recognize and decode a number of commands that are not specifically discussed herein such as, for example read/write commands sent to memory array 164. Discussion of those various commands and illustration in the drawings of specific components related to those commands are omitted for the sake of clarity and brevity.

In some embodiments, a calibration command can instruct the controller 190 of the memory device 104 to calibrate an impedance of each termination of termination component 188 (also referred to herein as "ZQ calibration").

In some embodiments, the controller 190 can perform (e.g., automatically) adjustments to the termination impedance. For example, after the ZQ calibration, changes to the termination impedance of termination component 188 (e.g., due to changes in the temperature and/or bus voltage) can be automatically corrected. In some embodiments, the termination component can be an On-Die Termination (ODT) circuit. As known, an ODT circuit can be adjusted to provide a matched impedance with respect to a connected data bus. In FIG. 1, the termination component 188 is depicted independently of the output buffer 176. However, it is also possible that the output buffer includes the termination component 188 as a part of the output buffer. In such cases, the ODT operation is performed by at least a part of the output buffer. For clarity, exemplary embodiments of the disclosure will be discussed with respect to termination component 188. However, those skilled in the art will recognize that the description is also applicable to cases in which the termination component 188 is part of the output buffer 176.

Upon receipt, the command decoder 160 routes the calibration command to the controller 190, which can be configured to set impedances of the terminations in the termination component 188 based on a calibration procedure initiated by the calibration command. Calibration of the impedances of the terminations in the termination component 188 may be needed because the impedances of the terminations can vary due to a change in the operating conditions such as, for example, temperature and bus voltage changes that can occur during the operation of the memory system 100. In addition, in some embodiments, changes in the termination impedance between calibrations can be accounted for by configuring the termination component 188 to be self-adaptive. In some embodiments, each termination of the termination component 188 can include a group of pull-up and pull-down transistors that are controlled (e.g., enabled (ON) or disabled (OFF)) by the controller 190. The controller 190 enables/disables the pull-up and pull-down transistors based on a pull-up code signal and a pull-down code signal, respectively, so that the impedance of the termination component 188 and thus the output buffer 176 matches the impedance of the connected data bus. In this way, signal reflections that result from impedance mismatches are avoided or minimized as much as possible.

Figure 2:
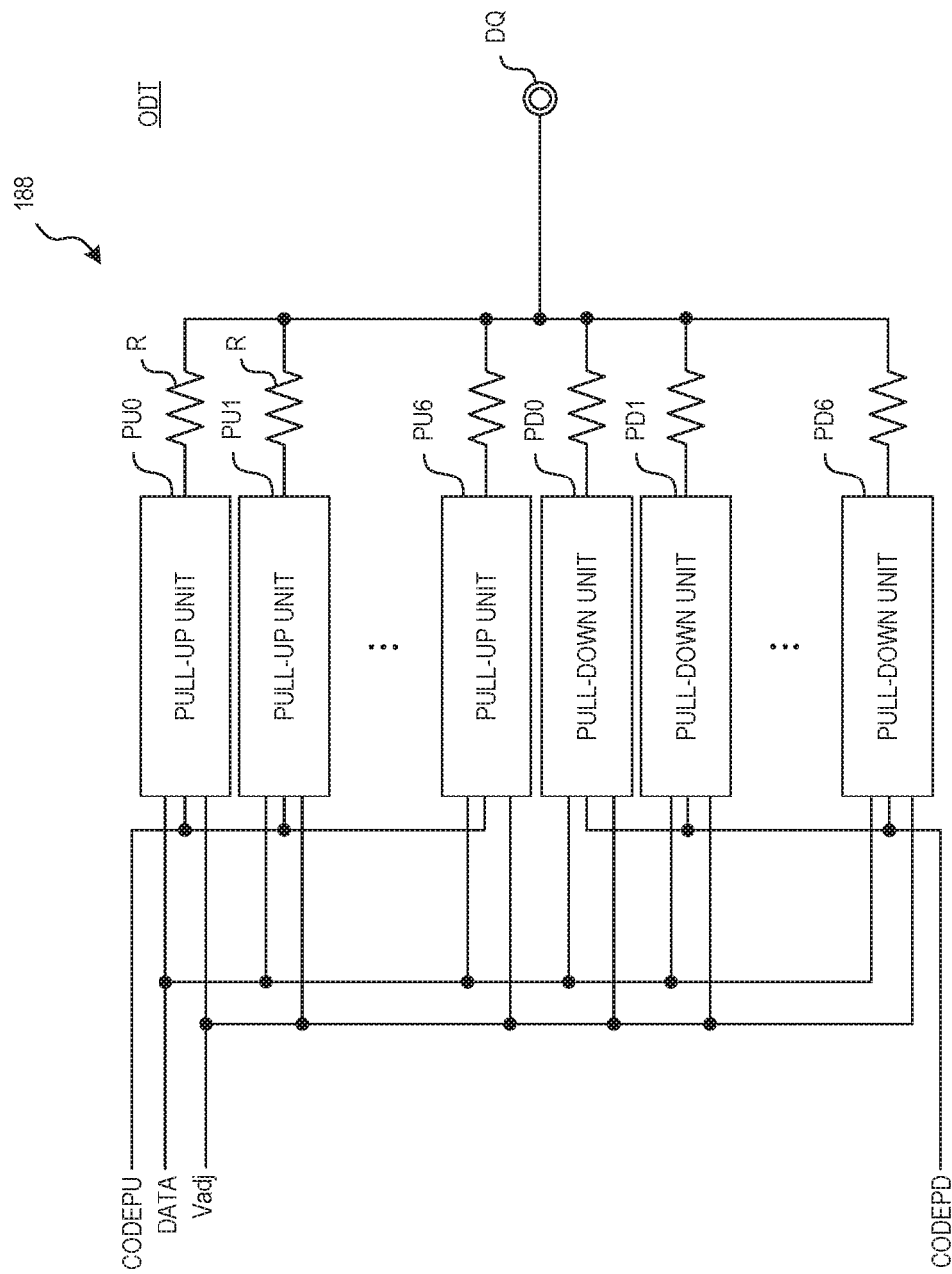
FIG. 2 is a block diagram of an embodiment of a termination component in accordance with the present disclosure.

The termination component 188 can include one or more pairs of pull-up units and pull-down units for each data input/output terminal. For example, in the illustrated embodiment of FIG. 2, the termination component 188 includes seven pull-up units PU0 to PU6 and seven pull-down units PD0 to PD6 for one data input/output terminal (or data bit) DQ. Each of the pull-up units PU0 to PU6 have the same circuit configuration, which includes a group of pull-up transistors. Each of the pull-up units PU0 to PU6 receives the pull-up calibration code CODEPU, the data DATA, and impedance adjustment signal Vadj. Similarly, each of the pull-down units PD0 to PD6 have the same circuit configuration, which includes a group of pull-down transistors. Each of the pull-down units PD0 to PD6 receives the pull-down calibration code CODEPD, the data DATA, and the impedance adjustment signal Vadj. The calibration codes CODEPU and CODEPD and the impedance adjustment signal Vadj are discussed further below. The output nodes of the pull-up units PU0 to PU6 and pull-down units PD0 to PD6 can be connected in common to a corresponding data input/output terminal DQ via resistors R.

Figure 3A:
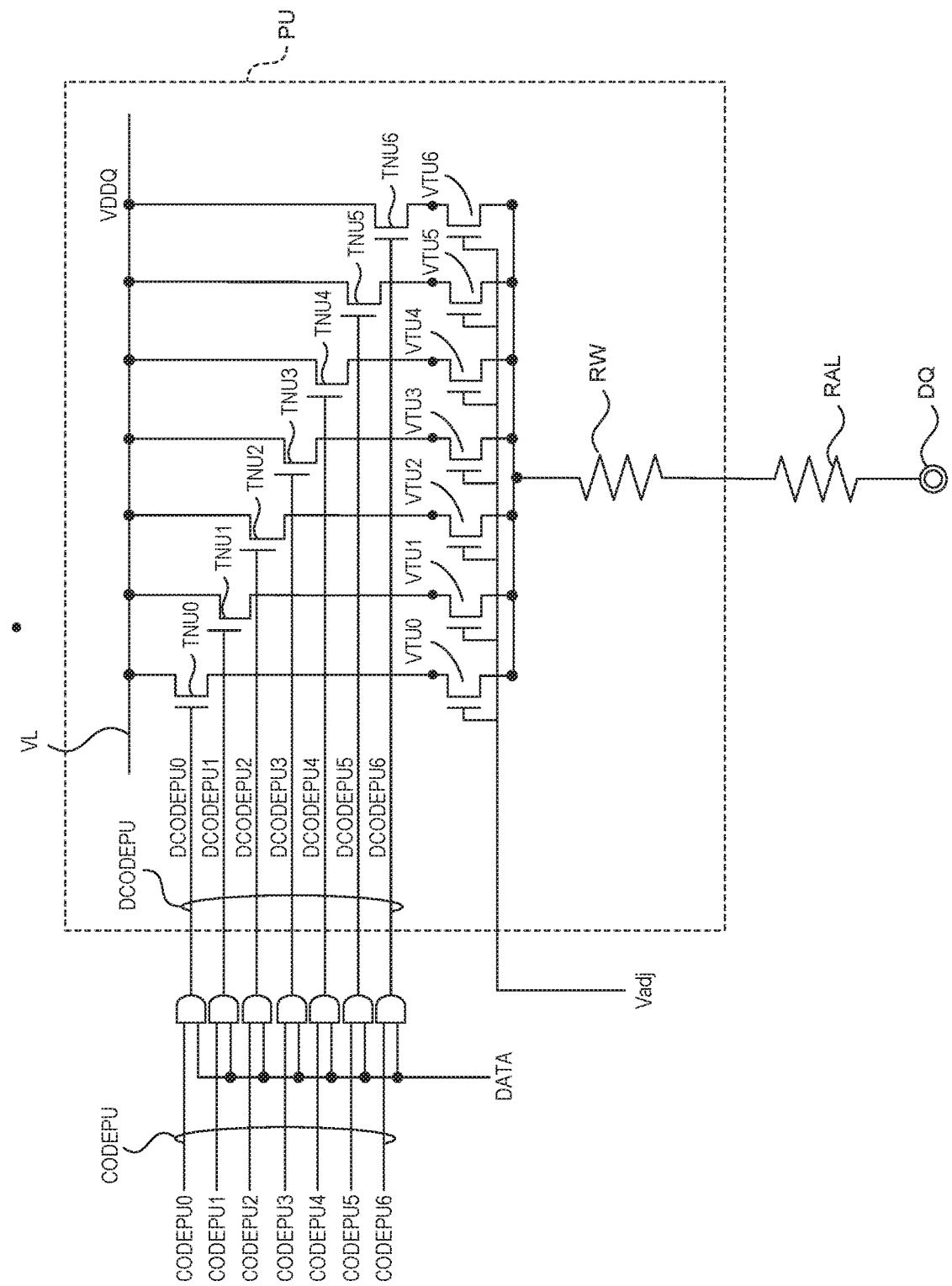
FIG. 3A is a schematic of an embodiment of a pull-up unit in accordance with the present disclosure.
Figure 3B:
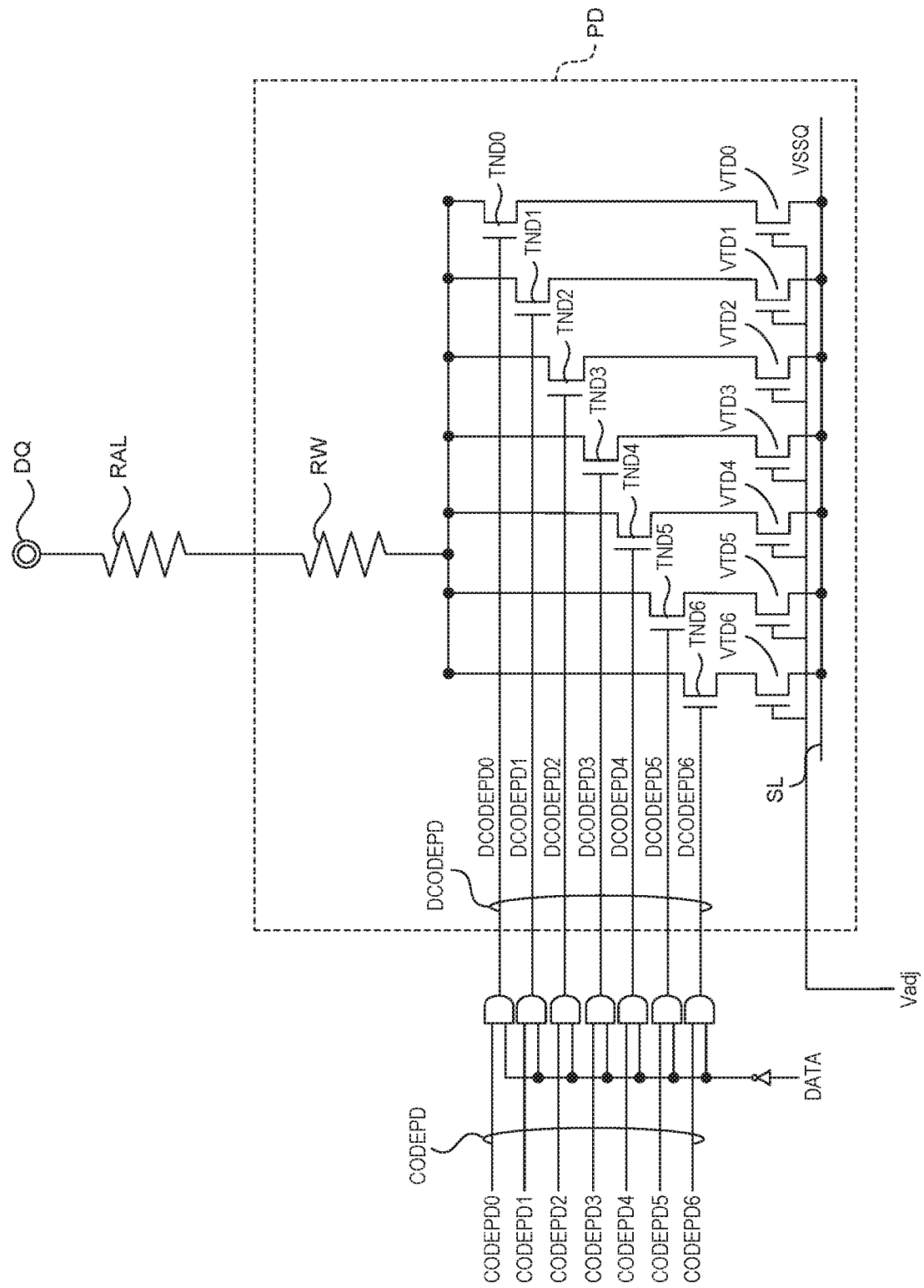
FIG. 3B is a schematic of an embodiment of a pull-down unit in accordance with the present disclosure.

FIGS. 3A and 3B illustrate exemplary embodiments of pull-up and pull-down unit circuits, respectively. Turning to FIG. 3A, the pull-up unit PU includes seven N-channel MOS transistors TNU0 to TNU6, seven N-channel MOS transistors VTU0 to VTU6, and resistors RW and RAL. Alternatively, the pull-up unit PU can include P-channel MOS transistors for either or both the TNU and VTU transistors. Of course, appropriate changes to the circuits that activate and/or adjust the TNU and VTU transistors will need to be made if the TNU and VTU transistors are PMOS rather than NMOS. Tuning to FIG. 3A, the drains of the transistors TNU0 to TNU6 can be connected in common to a power supply line VL, which supplies the power supply potential VDDQ (or another bus voltage such as e.g., VDD, VDD1, VDD2, etc). Each of the sources of the transistors TNU0 to TNU6 can be connected to respective drains of transistors VTU0 to VTU6. The sources of the transistors VTU0 to VTU6 can be connected to the data input/output terminals DQ via the resistors RW and RAL. The order of the transistors TNU and VTU in each transistor pair TNU/VTU is not limiting and the order of the transistors TNU and VTU in one or more of the transistor pairs TNU0/VTU0 to TNU6/VTU6 can be reversed. The resistor RW can be made of tungsten wire or the like, and can be about 120 ohms, for example. The resistor RAL can be made of aluminum wire, or the like, and can be a small resistor that is less than or equal to 1 ohm, for example.

The bits DCODEPU0 to DCODEPU6 of the code control signal DCODEPU are respectively supplied to the gate electrodes of the transistors TNU0 to TNU6. Accordingly, the seven transistors TNU0 to TNU6 can be controlled based on the value of the code control signal DCODEPU in such a way as to be selectively turned ON or OFF. As shown in FIG. 3A, the code control signal DCODEPU is generated by logically combining, by using an AND gate circuit, each bit of a code signal CODEPU and an internal data bit DATA. When the internal data bit DATA is at a low level, all the bits DCODEPU0 to DCODEPU6 of the code control signal DCODEPU are at a low level regardless of the value of the code signal CODEPU. As a result, all the transistors TNU0 to TNU6 are set to OFF. When the internal data bit DATA is at a high level, the value of the code control signal DCODEPU is the same as the value of the code signal CODEPU. As a result, the transistors TNU0 to TNU6 are selectively turned ON or OFF based on the individual bit values of the code control signal DCODEPU. The impedance of the pull-up unit PU and thus the data input/output terminal DQ can be set according to the value of the code signal CODEPU. The impedance of the pull-up units PU is set during a ZQ calibration as discussed further below. However, between ZQ calibrations, the impedance of the pull-up units PU can be adjusted based on an indication that the terminal impedance has changed (e.g., due to a change in the temperature of the memory devices 104 and/or a change in a bus voltage).

In some embodiments, the memory device 104 can include a self-adaptive termination impedance circuit that automatically adjusts for changes in the termination impedance of the pull-up units PU (e.g., due to changes in temperature and/or bus voltage in the memory device). For example, the transistors VTU0 to VTU6 can be configured to adjust (e.g., automatically) the termination impedance by appropriately varying the impedance of the transistors VTU0 to VTU6. If the termination impedances of transistors TNU0 to TNU6 increase, the impedances of corresponding transistors VTU0 to VTU6 can be adjusted down to compensate for the increase. Similarly, a decrease in the termination impedances of transistors TNU0 to TNU6 can be compensated for by increasing the impedances of the transistors VTU0 to VTU6. As seen in FIG. 3A, in some embodiments, the gates of the transistors VTU0 to VTU6 can be connected to a common impedance adjustment signal Vadj (e.g., a voltage signal) that can be varied, as discussed below, to adjust for a change in the termination impedances of the transistors TNU0 to TNU6. In other embodiments, each transistor VTU0 to VTU6 can have its own impedance adjustment signal Vadj. In some embodiments, one or more of the transistors VTU0 to VTU6 can be configured to operate in a linear region so that a change in the impedance adjustment signal Vadj changes an operating point within the linear region for the respective transistor VTU0 to VTU6. For example, the resistance of the transistor VTU0 to VTU6 can be varied by varying the impedance adjustment signal Vadj. Thus, by appropriately changing the impedance adjustment signal Vadj, any change in the termination impedance of transistors TNU0 to TNU6 can be cancelled out (or substantially cancelled out) by an equal and opposite change in the impedances (e.g., resistance) of the transistors VTU0 to VTU6. In some embodiments, the impedance adjustment can be done automatically by an impedance adjustment circuit 196 that self-adapts to changes in the termination impedance. The impedance adjustment circuit is discussed further below.

Turning to FIG. 3B, the pull-down unit PD includes seven N-channel MOS transistors TND0 to TND6, seven N-channel MOS transistors VTD0 to VTD6, and resistors RW and RAL. Alternatively, the pull-down unit PD can include P-channel MOS transistors for either or both the TND and VTD transistors. Of course, appropriate changes to the circuits that activate and/or adjust the TND and VTD transistors will need to be made if the TND and VTD transistors are PMOS rather than NMOS. The sources of the transistors VTD0 to VTD6 can be connected in common to a power supply line SL, which supplies ground potential VSSQ (or another bus voltage such as, e.g., VSS, GND, etc.). Each of the sources of the transistors TNU0 to TNU6 can be connected to respective drains of transistors VTU0 to VTU6. The drains of the transistors TND0 to TND6 can be connected to the data input/output terminals DQ via the resistors RW and RAL. The order of the transistors TND and VTD in each transistor pair TND/VTD is not limiting and the order of the transistors TND and VTD in one or more of the transistor pairs TND0/VTD0 to TND6/VTD6 can be reversed.

The bits DCODEPD0 to DCODEPD6 of the code control signal DCODEPD are respectively supplied to the gate electrodes of the transistors TND0 to TND6. Therefore, the seven transistors TND0 to TND6 can be controlled based on the value of the code control signal DCODEPD in such a way as to be selectively turned ON or OFF. As shown in FIG. 3B, the code control signal DCODEPD is generated by logically combining, by using an AND gate circuit, each bit of a code signal CODEPD and an inverted internal data bit DATA. When the internal data bit DATA is at a high level, all the bits DCODEPD0 to DCODEPD6 of the code control signal DCODEPD are at a low level regardless of the value of the code signal CODEPD. As a result, all the transistors TND0 to TND6 are set to OFF. When the internal data bit DATA is at a low level, the value of the code control signal DCODEPD is the same as the value of the code signal CODEPD. As a result, the transistors TND0 to TND6 are selectively ON or OFF based on the individual bit values of the code control signal DCODEPD. Similar to the pull-up unit PU, the impedance of the pull-down unit PD and thus the data input/output terminal DQ can be adjusted according to the value of the code signal CODEPD. The impedance of the pull-down units PD is set during a ZQ calibration as discussed further below. However, between ZQ calibrations, the impedance of the pull-down units PD can be adjusted based on an indication that the terminal impedance has changed (e.g., due to a change in the temperature of the memory devices 104 and/or a change is a bus voltage).

In some embodiments, the memory device 104 can include a self-adaptive termination impedance circuit that automatically adjusts for changes in the termination impedance of the pull-down units PD (e.g., due to changes in temperature and/or bus voltage in the memory device). For example, the transistors VTD0 to VTD6 can be configured to adjust the terminal impedance by appropriately varying the impedance of the transistors VTD0 to VTD6. If the termination impedances of transistors TND0 to TND6 increase, the impedances of transistors VTD0 to VTD6 can be adjusted down to compensate for the increase in the termination impedance of pull-down units PD. Similarly, a decrease in the termination impedances of transistors TND0 to TND6 can be compensated for by increasing the impedances of the transistors VTD0 to VTD6. As seen in FIG. 3B, in some embodiments, the gates of the transistors VTD0 to VTD6 can be connected to a common impedance adjustment signal Vadj (e.g., a voltage signal) that can be varied, as discussed below, to adjust for a change in the termination impedance of the transistors TND0 to TND6. In other embodiments, each transistor VTD0 to VTD6 can have its own impedance adjustment signal Vadj. In some embodiments, one or more of the transistors VTD0 to VTD6 can be configured to operate in a linear region so that a change in the impedance adjustment signal Vadj changes an operating point within the linear region for the respective transistor VTD0 to VTD6. For example, the resistance of the transistor VTD0 to VTD6 can be varied by varying the impedance adjustment signal Vadj. Thus, by appropriately changing the impedance adjustment signal Vadj, any change in the termination impedances of transistors TND0 to TND6 can be cancelled out (or substantially cancelled out) by an equal and opposite change in the impedances (e.g., resistance) of the transistors VTD0 to VTD6. In some embodiments, the impedance adjustment can be done automatically by an impedance adjustment circuit 196 that self-adapts to changes in the termination impedance. The impedance adjustment circuit is discussed further below. Those skilled in the art understand the paired configuration and operation of pull-up and pull-down units in the termination component 188 and thus, for brevity, the operation of the pull-up and pull-down units will not be further discussed.

Turning to FIG. 1, in some embodiments, the calibration circuit 192 sets (or calibrates) the impedance value of each termination in the termination component 188 based on an impedance measurement of a reference calibration device having a known impedance. For example, as shown in FIG. 1, the package 108 of the memory system 100 can include an external pin 116 (also referred to herein as the ZQ pin 116) that is coupled to a reference calibration device having a known impedance. In the illustrated exemplary embodiment, the reference calibration device can be a resistor 120 (also referred to herein as ZQ resistor 120) having a known impedance value RZQ (e.g., resistance). In some embodiments, the value of RZQ can be, for example 240 ohms±1%. Code signals CODEPU and CODEPD can be generated by the calibration circuit 192 based on an impedance measurement of ZQ resistor 120. Because ZQ resistor 120 is located external to the package 108, the impedance of ZQ resistor 120 is generally stable regardless of the operating conditions such as, for example, the temperature of the memory devices 104. The ZQ resistor 120 is coupled to one or more memory devices 104 via ZQ pad 112 in the respective memory devices 104.

In exemplary embodiments of the technology, the impedance target value corresponding to the code signal CODEPU for the pull-up units PU0 to PU6 is twice the value of ZQ resistor 120 and can be, for example, 2RZQ. The impedance target value corresponding to the code signal CODEPD for the pull-down units PD0 to PD6 is the value of ZQ resistor 120 and can be, for example, RZQ. Of course, the target impedance values of 2RZQ and RZQ for the pull-up and pull-down units, respectively, are not limiting and other embodiments can have different target impedances for either or both of the pull-up and pull-down units. In some embodiments, one or more of the memory devices 104 can use ZQ resistor 120 in an impedance calibration process, which is described in greater detail below.

In some embodiments, as part of the calibration command for calibrating the impedances of termination component 188, a known current generated by the calibration circuit 192 is passed through the ZQ resistor 120 via ZQ pin 116, and a voltage corresponding to the impedance of ZQ resistor 120 is measured at the ZQ pad 112. The impedance of the ZQ resistor 120 represents the impedance that each termination of the termination component 188 sees on the data bus to which it is coupled. The calibration circuit 192 takes the measured voltage at the ZQ pad 112 and compares the voltage to an internal reference voltage that corresponds to the desired impedance for each termination in the termination component 188. The result of the comparison can then be used to adjust calibration circuitry to step up or step down the voltage at the ZQ pad 112 so as to bring the ZQ pin 116 voltage closer to the reference voltage. The comparison process generates code signals CODEPU and CODEPD that can be used to enable/disable the various pull-up and pull-down transistors associated with the termination component 188 (also described herein as programming the termination component) to adjust their impedances so as to match that of the connected data bus.

Figure 4:
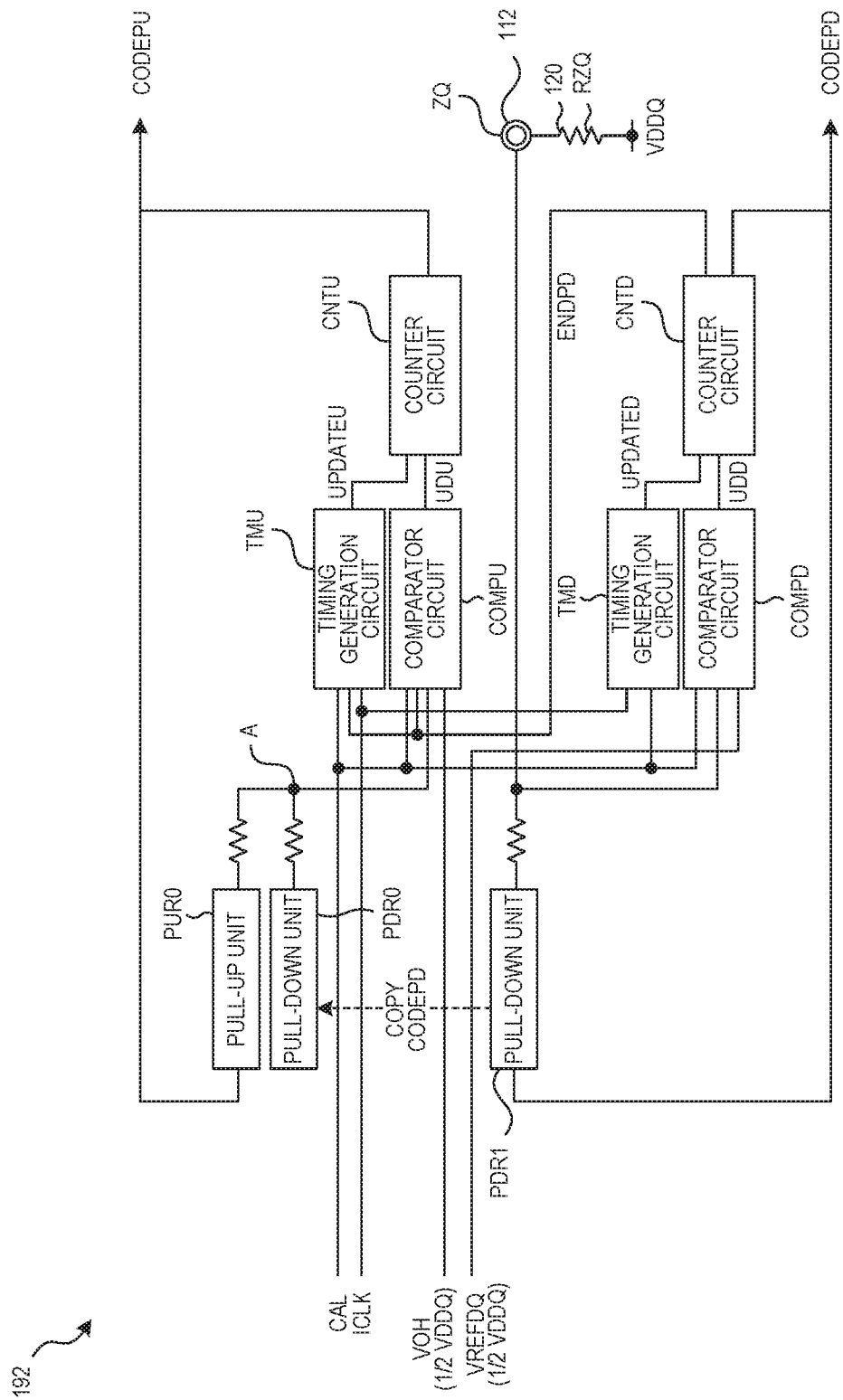
FIG. 4 is a schematic of an embodiment of a calibration circuit for a memory device in accordance with the present disclosure.

FIG. 4 illustrates an exemplary embodiment of a calibration circuit 192 that can generate the code signals CODEPU and CODEPD used to program the terminations in termination component 188 of the respective memory devices 104. In some embodiments, during the ZQ calibration process, the impedance adjustment signal Vadj (see FIGS. 3A and 3B) is set such that the operating point within the linear region of one or more of the transistors VTU0-VTU6 and VTD0-VTD6 is at a predetermined point in the linear region. For example, the predetermined point can be a mid-point of the linear region so that, after the ZQ calibration, the impedance can be adjusted equally in both directions (e.g., increase resistance and decrease resistance), if needed. In other embodiments, the impedance adjustment need not be equal in both directions and the predetermined operating point can be dependent on operating conditions such as temperature and/or bus voltage. For example, if the temperature during ZQ calibration is at a low end of the operating range for the memory device, the predetermined operating point can be near a high impedance point in the linear region of transistors VTU and VTD so that there is more room to decrease the impedance (e.g., resistance) as the temperature of the memory device increases. Conversely, if the temperature during ZQ calibration is at the high end of the operating range for the memory device, the predetermined operating point can be near a low impedance point in the linear region. With the transistors VTD0-VTD6 and VTU0-VTU6 set at a desired operating point within the linear region (e.g., at a desired resistance), the calibration circuit 192 can generate the code signals CODEPU and CODEPD to set the transistors TNU0-TNU6 and TND0-TND6, respectively.

As shown in FIG. 4, the output node of the pull-down unit PDR1 is connected to external ZQ resistor 120, via the ZQ pad 112, and to a comparator circuit COMPD. The comparator circuit COMPD compares, in response to the activation of the calibration command signal CAL, the potential at ZQ pad 112 with the reference potential VREFDQ and generates an up-down signal UDD based on the result thereof. The value of reference potential VREFDQ is set to a value that will give the desired impedance for the pull-down unit. In this case, a reference potential VREFDQ of ½ VDDQ is used in order to get a desired impedance of RZQ for the pull-down units PD0-PD6 in the termination component 188. The up-down signal UDD is supplied to a counter circuit CNTD, and a code signal CODEPD (which is a multi-bit count value of the counter circuit CNTD) is stepped up or down based on the up-down signal UDD. The stepping-up or stepping-down of the counter circuit CNTD is performed in synchronization with an update signal UPDATED. The update signal UPDATED is generated by a timing generation circuit TMD in synchronization with the internal clock signal ICLK if the calibration signal CAL is activated. The comparator circuit COMPD performs the comparison between the potential at the ZQ pad 112 and the reference potential VREFDQ until the potential at the ZQ pad 112 and the reference potential VREFDQ are within a predetermined value and/or the counter circuit CNTD enters a dither condition (e.g., an oscillation between up and down on the up-down signal UDD). Once the comparison result is within a predetermined value and/or a dither condition is reached, the counter circuit CNTD can generate a signal ENDPD to indicate that the code signal CODEPD is at a calibrated value (also referred to herein as a "calibrated code signal CODEPD"). That is, the code signal CODEPD is at a value that will program the pull-down units in termination component 188 to an impedance that matches the connected data bus. The counter circuit CNTD maintains the calibrated code signal CODEPD value until the next calibration cycle.

To calibrate the code signal CODEPU, exemplary embodiments of the present technology can use a pull-down unit that has been programmed with the calibrated code signal CODEPD. As shown in FIG. 4, after programming the pull-down unit PDR1, the calibrated code signal CODEPD is copied to the pull-down unit PDR0. Of course, the counter circuit CNTD can also update the pull-down unit PDR0 with an intermediate code signal CODEPD during the calibration process at the same time the updates are sent to the pull-down unit PDR1. Based on the calibrated code signal CODEPD, the appropriate transistors in pull-down unit PDR0 are turned ON or OFF (programmed) to set (or calibrate) the impedance, which in this case is RZQ. The pull-down unit PDR0 programmed with the desired impedance can then be used to determine the calibrated code signal CODEPU.

As shown in FIG. 4, the pull-up unit PUR0 and pull-down unit PDR0 are connected at a common connection point A via respective resistors. The connection point A is connected to a comparator circuit COMPU that compares, in response to the activation of the calibration signal CAL, the potential of the connection point A with the reference potential VOH and generates an up-down signal UDU based on the result thereof. The up-down signal UDU is supplied to a counter circuit CNTU, and a code signal CODEPU, which is a count value of the counter circuit CNTU, is stepped up or stepped down based on the up-down signal UDU. The stepping-up or stepping-down of the counter circuit CNTU is performed in synchronization with an update signal UPDATEU. The update signal UPDATEU is generated by a timing generation circuit TMU in synchronization with the internal clock signal ICLK if the calibration signal CAL and an end signal ENDPD are activated. The comparator circuit COMPU performs the comparison between the potential at point A and the reference potential VOH until the potential of point A and the reference potential VOH are within a predetermined value and/or the counter circuit CNTU enters a dither condition (e.g., an oscillation between up and down on the up-down signal UDU). In the exemplary embodiment of FIG. 4, the reference potential VOH can be ½ VDDQ. Once the comparison result is within a predetermined value and/or a dither condition is reached, the counter circuit CNTU maintains the last code signal CODEPU as the calibrated code signal CODEPU, and the calibrated code signal CODEPU is used to program the pull-up transistors associated with the termination component 188. In this case, the impedance values of the pull-up unit PUR0 and the pull-up transistors associated with the termination component 188 are set (or calibrated) to match the value of ZQ resistor 120 (e.g., RZQ).

The above-described calibration procedure determines the calibrated code signals CODEPU and CODEPD in a memory device 104. However, as discussed above, more than one memory device 104 can share the ZQ pin 116. Because multiple memory devices 104 can share a single ZQ pin 116, contention issues can occur in the event that multiple memory devices 104 perform ZQ calibration operations concurrently. For example, in the configuration of FIG. 1 where the memory devices 104 communicate with separate memory controllers 140, it may be possible for both memory controllers 140 to issue calibration commands to their respective memory devices 104 to concurrently perform respective calibration operations. To prevent contention issues from occurring on ZQ pin 116, each controller 190 can include an arbiter circuit (not shown) to resolve the contentions. For example, arbiter circuits from multiple memory devices 104 can share a data bus (not shown) and use a token ring to prevent a memory device 104 from accessing the ZQ pin 116 until the arbiter circuit of that memory device 104 has the token. Another method to prevent contention issues is to measure a potential of the ZQ pin 116 to see if another memory device 104 is accessing the ZQ pin 116 and if so, wait a predetermined time before attempting to connect to the ZQ pin 116. Because those skilled in the art understand arbiter circuits, for brevity, arbiter circuits will not be discussed further except as necessary to describe exemplary embodiments of the present technology and/or to describe non-conventional arbiter circuits and methods.

As discussed above, each package 108 can have more than one semiconductor component, such as, for example, a die. For example, in some embodiments, the package 108 can have 16 semiconductor components (e.g., dies), which can each have a memory device 104. The ZQ pads 112 of the 16 memory devices 104 can be connected to a common ZQ pin 116 on package 108 and arbiter circuits can ensure that multiple memory devices 104 do not perform ZQ calibrations concurrently, as discussed above. However, because there are 16 memory devices 104, sequentially performing all 16 ZQ calibrations can get very long. Even in memory systems where parallel ZQ calibration techniques might be used, the power used during the ZQ calibration process is not insignificant. Accordingly, in exemplary embodiments of the present technology, the memory devices 104 are configured to include a self-adaptive termination impedance circuit so that the frequency of the ZQ calibrations can be minimized. Accordingly, in some embodiments, the termination component 188 automatically adjusts for changes in the termination impedance based on an impedance adjustment signal Vadj.

Figure 5:
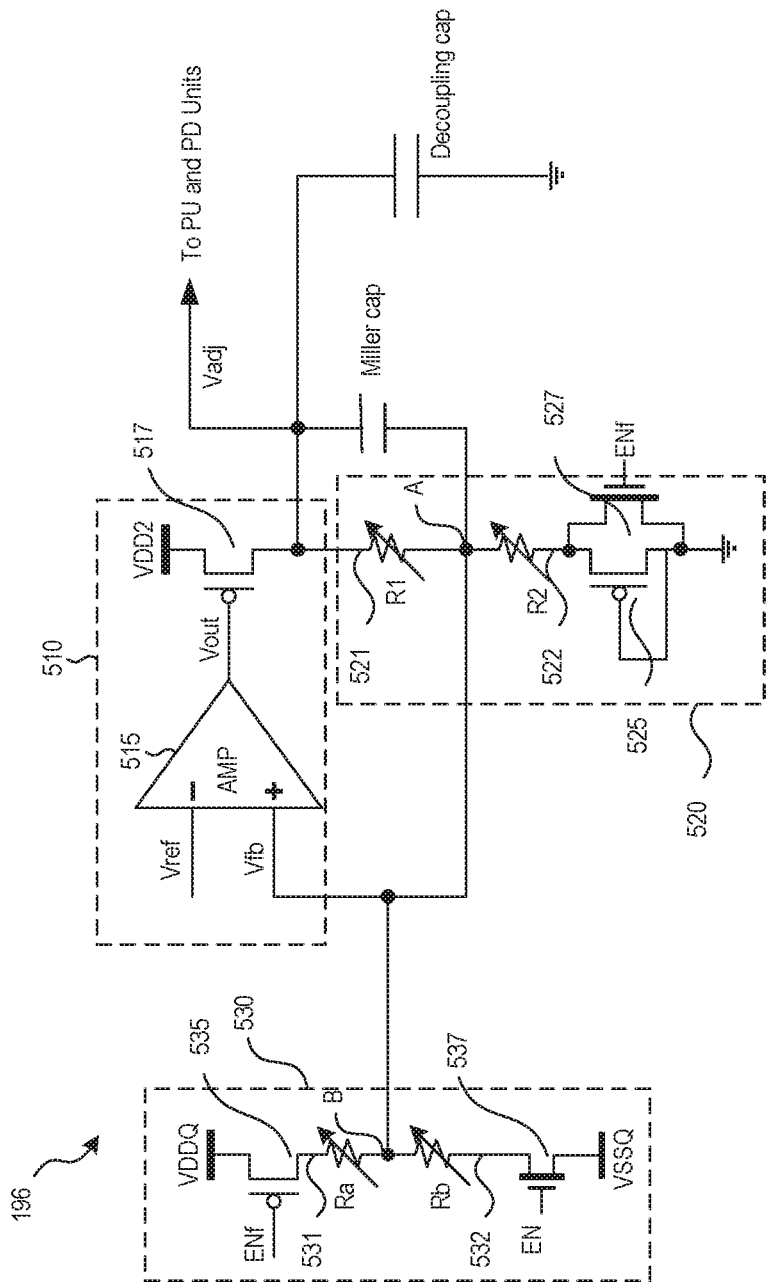
FIG. 5 is a schematic of an embodiment of an impedance adjustment circuit in accordance with the present disclosure.

FIG. 5 illustrates an impedance adjustment circuit that provides a termination impedance adjustment signal Vadj in accordance with an embodiment of the present technology. In some embodiments, the impedance adjustment circuit 196 can be a voltage generator that includes a closed loop differential amplifier structure. For example, an impedance adjustment circuit 196 can include an amplifier assembly 510. The amplifier assembly 510 can include a differential amplifier circuit 515 and an adjustment signal transistor 517, which in some embodiments can be a PMOS transistor. The internal circuit structure of differential amplifier 515 is known in the art and thus, for brevity, will not be discussed further. In some embodiments, the differential amplifier circuit 515 receives a feedback signal Vfb that provides an indication of a change in the impedance of the pull-up units PU0-PU6 and/or the pull-down units PD0-PD6. The feedback signal Vfb can be received by the positive (+) input of the differential amplifier 515 and a reference signal Vref can be received by the negative (−) input of the differential amplifier. The differential amplifier 515 compares the feedback signal Vfb to the reference signal Vref and outputs an output signal Vout that is proportional to the difference. Thus, as Vfb goes up, the output Vout goes up, and as Vfb goes down, the output Vout goes down. In some embodiments, the output signal Vout is sent to the gate of the adjustment signal transistor 517. The source of the adjustment signal transistor 517 can be connected to a voltage source that is also used by the circuits that generate the calibrated code signals CODEPU and/or CODEPD (e.g., VDD2) so that the impedance adjustment signal Vadj can remain stable even if the voltage source (e.g., VDD2) changes. Of course, in other embodiments, source of the adjustment signal transistor 517 can be connected to another voltage source (e.g., VDD1 or some other bus voltage). The drain of the adjustment signal transistor 517 can be connected to ground (or some other bus voltage) via a resistance circuit. In some embodiments, the impedance adjustment signal Vadj is transmitted to the termination component 188 via a connection between the drain of the adjustment signal transistor 517 and the gates of the transistors VTU0-VTU6 and/or VTD0-VTD6 of pull-up units PU0-PU6 and pull-down units PD0-PD6, respectively.

In some embodiments, the adjustment signal transistor 517 is configured to operate in the linear region. In some embodiments, the adjustment signal transistor 517 has a large area in comparison to the area of impedance sense transistor 525 so that changes in temperature do not affect the impedance of transistor 517 as much as they do transistor 525. As the output signal Vout varies, the impedance (e.g., resistance) of the adjustment signal transistor 517 varies proportionally, and the voltage level of the impedance adjustment signal Vadj is inversely proportional to the impedance of the adjustment signal transistor 517. Accordingly, as the voltage level of feedback signal Vfb increases, the voltage level of the impedance adjustment signal Vadj decreases. Conversely, as the voltage level of feedback signal Vfb decreases, the voltage level of the impedance adjustment signal Vadj increases. As discussed above, the impedance adjustment signal Vadj (e.g., a voltage signal) can be varied to change the termination impedance of the pull-up and pull-down units PU and PD respectively. In the embodiments of FIGS. 3A and 3B, the transistors VTU0-VTU6 and VTD0-VTD6 are configured such that the respective impedances are inversely proportional to the voltage level of the impedance adjustment signal Vadj. Accordingly, the impedance values (e.g., resistance) of transistors VTU0-VTU6 and VTD0-VTD6 are proportional to the voltage level of the feedback signal Vfb. That is, as the voltage level of the feedback signal Vfb increases, the impedances of the transistors VTU0-VTU6 and VTD0-VTD6 will increase, and as the voltage level of the feedback signal Vfb decreases, the impedances of the transistors VTU0-VTU6 and VTD0-VTD6 will decrease.

The value of the reference signal Vref that is received by the differential amplifier 515 can be determined during factory calibration of the memory device 104. In some embodiments, the reference signal Vref is not changed after factory calibration. In other embodiments, the value of the reference signal Vref is set during each ZQ calibration. For example, as discussed above, the voltage level of the impedance adjustment signal Vadj can be set to a predetermined value so that the transistors VTD0-VTD6 and VTU0-VTU6 are at a desired impedance value (e.g., resistance) during the ZQ calibration process. In some embodiments, during the ZQ calibration process, the reference signal Vref can be adjusted so as to provide the predetermined value for Vadj. After the ZQ calibration, the Vref value can remain fixed until the next ZQ calibration process.

In some exemplary embodiments of the present technology, the impedance adjustment circuit 196 can include an impedance sense circuit 520 and/or a voltage sense circuit 530. The impedance sense circuit 520 is configured to provide an indication of a change in the termination impedance of the pull-up units PU and/or the pull-down units PD due to a change in the temperature of the memory device 104. As seen in FIG. 5, the impedance sense circuit 520 includes a voltage divider (with resistors R1 and R2) that is connected in series with an impedance sense transistor 525. The resistors R1 and R2 of the voltage divider are connected in series at a common point A. As seen in FIG. 5, the voltage at common point A is connected to the feedback signal Vfb input of the differential amplifier 515.

The point 521 of resistor R1 is connected to the drain of the adjustment signal transistor 517 and thus receives the voltage Vadj. The end 522 of resistor R2 can be connected to the source of the impedance sense transistor 525. In some embodiments, the impedance sense transistor 525 can be a PMOS transistor and the gate can be connected to the drain. The drain of the impedance sense transistor 525 can be connected to ground (or another low bus voltage such as, e.g., VSS, VSSQ, etc.). In some embodiments, an on/off transistor 527 can be connected in parallel with the source and drain of the impedance sense transistor 525 so that the impedance sense circuit 520 can be selectively turned ON or OFF. For example, as seen in FIG. 5, a high voltage level on the enable signal ENf turns ON the transistor 527 to short the impedance sense transistor 525 and turn OFF the impedance sense circuit 520 when temperature compensation is not desired, and a low voltage level on the enable signal ENf turns OFF the transistor 527 to place the impedance sense transistor 525 in the current path of the impedance sense circuit 520 when temperature compensation is desired.

In the embodiment of FIG. 5, the impedance sense transistor 525 is configured to operate in a border region between the linear region and the saturation region of impedance sense transistor 525. When the temperature of the memory device 104 changes, the impedance of the impedance sense transistor 525 will change in a manner that is inversely proportional. For example, as the temperature of memory device 104 increases, the impedance (e.g., resistance) of impedance sense transistor 525 decreases, and as the temperature of memory device 104 decreases, the impedance (e.g., resistance) of impedance sense transistor 525 increases. In some embodiments, an NMOS transistor can be used as the impedance sense transistor in which case the impedance will change proportionally with temperature. Of course, if an NMOS transistor is used, those skilled in the art understand that appropriate changes to the circuitry must be made. Turning to the embodiment of FIG. 5, as the impedance of the impedance sense transistor 525 changes, the voltage at common point A and thus the feedback signal Vfb going to the differential amplifier 515 also changes proportionally. Accordingly, as the temperature of the memory device 104 increases, the impedance of the impedance sense transistor 525 decreases and the voltage level of the feedback signal Vfb also decreases. As discussed above, when the voltage level of the feedback signal Vfb decreases, the voltage level of the impedance adjustment signal Vadj increases. With an increased gate voltage at the transistors VTU0-VTU6 and VTD0-VTD6 due to the increased voltage Vadj, the impedances of the transistors VTU0-VTU6 and VTD0-VTD6 will decrease. Conversely, when the temperature of the memory device decreases, the voltage Vadj at the gates of the transistors VTU0-VTU6 and VTD0-VTD6 will decrease and the impedances of the transistors VTU0-VTU6 and VTD0-VTD6 will increase.

During operation, for memory devices that do not have an impedance adjustment circuit 196, when the temperature of the memory device changes, the termination impedance changes proportionally, which can cause problems with signal reflection on the DQ data line until the next ZQ calibration is performed. In exemplary embodiments of the present technology, when the temperature of the memory device 104 changes, the impedances of transistors TNU and/or TND will still change proportionally. However, the impedance adjustment circuit 196 changes the voltage Vadj on the gates of the corresponding transistors VTU and/or VTD such that the change in the impedances of transistors VTU and/or VTD is equal and opposite to that of the transistors TNU and/or TND. Accordingly, the changes in impedances for each transistor pair TNU/VTU and/or TND/VTD cancels out (or substantially cancels out). In some embodiments, the transistors VTU and/or VTD are sized such that changes in impedances (e.g., resistances) are balanced with the changes in impedances (e.g., resistances) of corresponding transistors TVU and/or TND.

The voltage sense circuit 530 is configured to provide an indication of a change in the bus voltage in the memory device 104. Similar to the change in temperature discussed above, if not compensated for, changes in the bus voltage (e.g., bus voltage VDDQ, VSSQ, or some other bus voltage) after the ZQ calibration can cause problems with signal reflection on the DQ data line until the next ZQ calibration is performed. For example, if the bus voltage VDDQ increases, the impedance on transistors TVU0 TVU6 decreases, unless compensated for. As seen in FIG. 5, the voltage sense circuit 530 includes a voltage divider with resistors Ra and Rb that are connected in series at a common point B. As seen in FIG. 5, the voltage at common point B is connected to the feedback signal Vfb input of the differential amplifier 515.

The point 531 of resistor Ra can be connected to a bus voltage VDDQ (or some other bus voltage such as, e.g., VDD, VDD1, VDD2, etc.) and point 532 of resistor Rb can be connected to bus voltage VSSQ (or some other bus voltage such as, e.g., VSS, GND, etc.). In some embodiments, an on/off transistor 535 can be connected in series between the bus voltage VDDQ and point 531 of the resistor Ra and a second on/off transistor 537 can be connected in series with the point 532 of resistor Rb and the bus voltage VSSQ so that the voltage sense circuit 530 can be selectively turned ON or OFF, as desired. For example, as seen in FIG. 5, a high voltage level on the enable EN signal and the corresponding low voltage on the ENf signal respectively turn ON the transistor 537 and the transistor 535 to turn ON the voltage sense circuit 530. Of course, in some embodiments, a single on/off transistor can be used. In some embodiments, the enable EN/ENf signals for the voltage sense circuit 530 and the impedance sense circuit 520 can be different. In other embodiments, the enable EN/ENf signals for the voltage sense circuit 530 and the impedance sense circuit 520 can be the same. If the bus voltage VDDQ and/or VSSQ changes during operation, the voltage at common point B and thus feedback signal Vfb changes accordingly. Those skilled in the art will understand that the operation of the amplifier assembly 510, including the changes in the impedance adjustment signal Vadj based on the changes in the feedback signal Vfb, is similar to that discussed above and thus, for brevity, is not repeated. In addition, similar to the adjustments discussed above, if the bus voltage (e.g., VDDQ, VDD, VDD1, VDD2, VSSQ, VSS, GND, etc.) changes during operation, any impedance changes in transistors TVU0 TVU6 and/or TND0-TND6 can be cancelled out (or substantially cancelled out) by equal and opposite changes in the impedances of transistors VTU0-VTU6 and/or VTD0-VTD6, as appropriate.

In the above embodiments, the resistors R1 and R2 and Ra and Rb of the respective voltage divider circuits are sized to achieve a desired rate of compensation. Ideally, the desired rate of compensation is such that the changes in the impedances due to changes in the temperature and/or bus voltage are cancelled 100% (or substantially 100%). The resistors R1, R2, Ra, and Rb can be variable resistors that are calibrated (trimmed) during factory calibration. In some embodiments, the memory systems can be configured to provide in-service trimming of resistors R1, R2, Ra, and Rb. In some embodiments, the impedance adjustment circuit 196 can include other components to minimize signal noise such as miller and decoupling capacitors.

Figure 6:
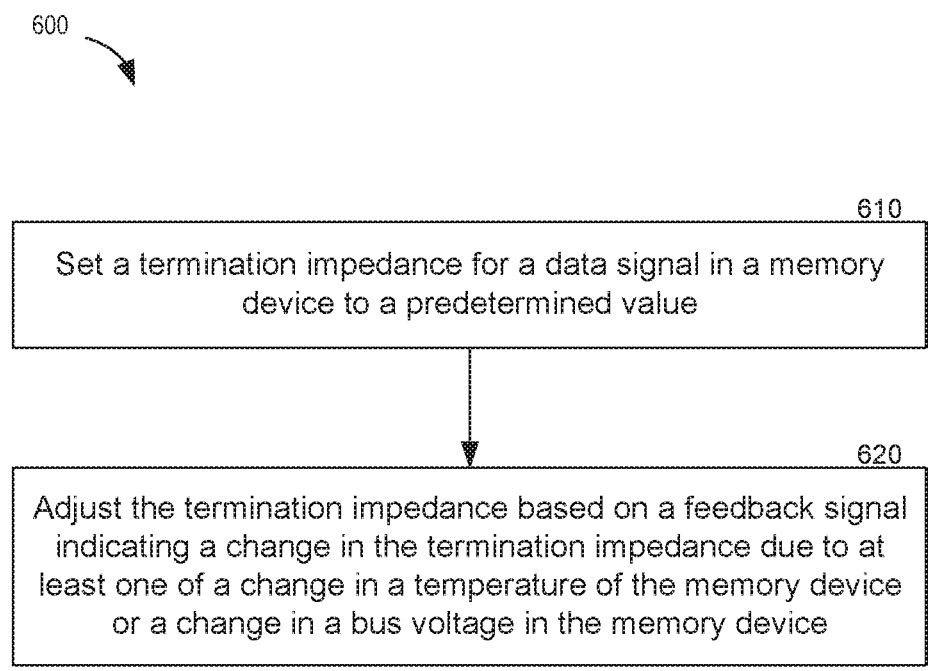
FIG. 6 is a flow diagram for an embodiment of a procedure for adjusting a termination impedance in accordance with the present disclosure.

FIG. 6 is a flow diagram illustrating example method 600 for automatically adjusting for changes in termination impedances due to changes in temperature and/or bus voltage in the memory systems. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the controller 190, controller 140 and/or another controller. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 610, the processing device (e.g., controller 190, controller 140 and/or another controller) sets a termination impedance for a data signal in a memory device to a predetermined value. For example, as discussed above, the calibration device 192 generates the codes CODEPU and CODEPD used by the termination component 188 for turning ON the appropriate transistors TNU0-TNU6 and/or TND0-TND6, respectively.

At block 620, the processing device (e.g., controller 190, controller 140 and/or another controller) adjusts the termination impedance based on a feedback signal indicating a change in the termination impedance due to at least one of a change in a temperature of the memory device or a change in a bus voltage in the memory device. For example, as discussed above, impedance adjustment circuit 196 changes the voltage Vadj on the gates of transistors VTU0-VTU6 and/or VTD0-VTD6 such that the change in the impedances of transistors VTU0-VTU6 and/or VTD0-VTD6 is equal and opposite that of the corresponding transistors TVU0-TVU6 and/or TND0-TND6.

In the above embodiments, a single impedance adjustment circuit 196 outputs an impedance adjustment signal Vadj to both the pull-up units PU and the pull-down units PD. In other embodiments, the pull-up units PU and the pull-down units PD can have respective impedance adjustment circuits (e.g., if the adjustment signal Vadj is different between the pull-up units PU and the pull-down units PD). In the above embodiments, although bus voltages VDDQ and VSSQ, a VOH of ½ VDDQ, and an external resistor RZQ of 240 ohms are used for explanation purposes in the exemplary embodiments of a termination component 188, a calibration circuit 192, and an impedance adjustment circuit 196, other bus voltages (e.g., VDD, VDD1, VDD2, VSS, GND, etc.), other VOH values (e.g., ⅓ VDDQ, etc.), and other external resistor RZQ values (e.g., 120 ohms, etc.) can be used with appropriate changes to the respective circuits.

In the embodiments described above, the calibrated code signal CODEPD of a memory device is determined first and then the calibrated code signal CODEPU of the memory device is determined based on the calibrated code signal CODEPD. However, those skilled in the art understand that the calibrated code signal CODEPU can be determined first and then the calibrated code signal CODEPD can be determined based on the calibrated code signal CODEPU. In addition, in the embodiments described above, the internal reference calibration device is a pull-up unit. However, those skilled in the art understand that the internal reference calibration device can be a pull-down unit.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. For example, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." Additionally, the terms "comprising," "including," "having," and "with" are used throughout to mean including at least the recited feature(s) such that any greater number of the same feature and/or additional types of other features are not precluded.

The processing device (e.g., controller 190, controller 140 and/or another controller) represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device (e.g., controller 190, controller 140 and/or another controller) can also be one or more special-purpose processing devices such as an application specific integrated circuit (ASIC), a field programmable gate array (FPGA), a digital signal processor (DSP), network processor, or the like. The processing device (e.g., controller 190, controller 140 and/or another controller) is configured to execute instructions for performing the operations and steps discussed herein.

A machine-readable storage medium (also known as a computer-readable medium) on which is stored one or more sets of instructions or software embodying any one or more of the methodologies or functions is described herein. The machine-readable storage medium can be, for example, memory system 100 or another memory device. The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

I claim:

1. An apparatus, comprising:
   a termination circuit providing a termination impedance for a data signal in a memory device;
   a calibration circuit configured to set the termination impedance to a predetermined value; and
   an impedance adjustment circuit configured to adjust the termination impedance based on a feedback signal indicating a change in the termination impedance due to at least one of a change in a temperature of the memory device or a change in a bus voltage in the memory device,
   wherein the termination circuit has at least one transistor that is configured to operate in a first linear region,
   wherein the impedance adjustment circuit provides an adjustment signal to a gate connection of the at least one transistor to control an operating point within the first linear region of the at least one transistor based on the feedback signal, the operating point corresponding to an impedance of the at least one transistor,
   wherein the impedance adjustment circuit includes an adjustment signal transistor that is operated in a second linear region based on the feedback signal, and
   wherein the adjustment signal is based on an impedance of the adjustment signal transistor.

2. The apparatus of claim 1, wherein the adjustment to the termination impedance is inversely proportional to the change in the temperature.

3. The apparatus of claim 1, wherein the adjustment to the termination impedance is proportional to the change in the bus voltage.

4. The apparatus of claim 1, wherein the termination circuit includes at least one second transistor, and
   wherein the setting of the termination impedance includes turning on the at least one second transistor based on a calibration code signal generated by the calibration circuit.

5. The apparatus of claim 4, wherein the at least one transistor is connected in series with the at least one second transistor.

6. The apparatus of claim 4, wherein the adjustment signal sets the operating point at a predetermined point within the first linear region during the setting of the termination impedance by the calibration circuit.

7. The apparatus of claim 6, wherein the predetermined point is at a mid-point of the first linear region.

8. The apparatus of claim 1, wherein the impedance adjustment circuit includes an amplifier circuit,
   wherein the impedance adjustment circuit is configured such that an output of the amplifier circuit is connected to a gate of the adjustment signal transistor to change the impedance of the adjustment signal transistor based on the feedback signal.

9. The apparatus of claim 8, wherein the impedance adjustment circuit further includes a voltage sense circuit, the voltage sense circuit includes a voltage divider circuit having a first resistor connected in series with a second resistor at a common point, the common point carrying the feedback signal and connected to a feedback input of the amplifier circuit, and
   wherein the voltage divider circuit is connected to the bus voltage in the memory device such that a change in the bus voltage changes the feedback signal at the common point.

10. The apparatus of claim 9, wherein the change in the feedback signal is proportional to the change in the bus voltage.

11. An apparatus, comprising:
a termination circuit providing a termination impedance for a data signal in a memory device;
a calibration circuit configured to set the termination impedance to a predetermined value; and
an impedance adjustment circuit configured to adjust the termination impedance based on a feedback signal indicating a change in the termination impedance due to at least one of a change in a temperature of the memory device or a change in a bus voltage in the memory device,
wherein the termination circuit has at least one transistor that is configured to operate in a linear region,
wherein the impedance adjustment circuit provides an adjustment signal to a gate connection of the at least one transistor to control an operating point within the linear region of the at least one transistor based on the feedback signal, the operating point corresponding to an impedance of the at least one transistor,
wherein the impedance adjustment circuit includes an amplifier circuit and an adjustment signal transistor that is operated in a linear region,
wherein the impedance adjustment circuit is configured such that an output of the amplifier circuit is connected to a gate of the adjustment signal transistor to change an impedance of the adjustment signal transistor based on the feedback signal,
wherein the adjustment signal is based on the impedance of the adjustment signal transistor,
wherein the impedance adjustment circuit further includes an impedance sense circuit that includes:
a voltage divider circuit having a first resistor connected in series with a second resistor at a common point, the common point carrying the feedback signal and connected to a feedback input of the amplifier circuit,
an impedance sense transistor connected in series with the voltage divider circuit, the impedance sense transistor configured such that a change in temperature of the memory device changes an impedance of the impedance sense transistor, and
wherein the feedback signal at the common point is changed based on the change in the impedance of the sense transistor.

12. The apparatus of claim 11, wherein the change in the feedback signal is inversely proportional to the change in the temperature.

13. The apparatus of claim 11, wherein the change in the impedance of the impedance sense transistor is inversely proportional to the change in the temperature.

14. The apparatus of claim 11, wherein the change in the impedance of the impedance sense transistor is proportional to the change in the temperature.

15. The apparatus of claim 11, wherein the impedance sense transistor is configured to operate at a boundary region between a linear region and a saturation region of the impedance sense transistor.

16. A method, comprising:
setting a termination impedance for a data signal in a memory device to a predetermined value;
adjusting the termination impedance based on a feedback signal indicating a change in the termination impedance due to at least one of a change in a temperature of the memory device or a change in a bus voltage in the memory device,
wherein the adjusting the termination impedance includes:
operating at least one transistor in a first linear region, and
providing an adjustment signal to a gate connection of the at least one transistor to control an operating point within the first linear region of the at least one transistor based on the feedback signal, the operating point corresponding to an impedance of the at least one transistor, and
wherein the adjustment signal is based on an impedance of an adjustment signal transistor that is operated in a second linear region based on the feedback signal.

17. The method of claim 16, wherein the adjustment to the termination impedance is inversely proportional to the change in the temperature.

18. The method of claim 16, wherein the adjustment to the termination impedance is proportional to the change in the bus voltage.

19. The method of claim 16, wherein the setting of the termination impedance includes turning on at least one second transistor based on a calibration code signal generated by a calibration circuit, the at least one transistor is connected in series with the at least one second transistor.

20. The method of claim 19, wherein the adjustment signal sets the operating point at a predetermined point within the first linear region during the setting of the termination impedance by the calibration circuit.

21. The method of claim 20, wherein the predetermined point is at a mid-point of the first linear region.

\* \* \* \* \*